US006884564B2

(12) United States Patent
Feiring et al.

(10) Patent No.: US 6,884,564 B2
(45) Date of Patent: Apr. 26, 2005

(54) FLUORINATED POLYMERS HAVING ESTER GROUPS AND PHOTORESISTS FOR MICROLITHOGRAPHY

(75) Inventors: Andrew E. Feiring, Wilmington, DE (US); Jerald Feldman, Wilmington, DE (US); Frank L. Schadt, III, Wilmington, DE (US); Gary Newton Taylor, Northborough, MA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/489,799

(22) PCT Filed: Oct. 25, 2002

(86) PCT No.: PCT/US02/36292
§ 371 (c)(1),
(2), (4) Date: Mar. 16, 2004

(87) PCT Pub. No.: WO03/040827
PCT Pub. Date: May 15, 2003

(65) Prior Publication Data
US 2004/0180287 A1 Sep. 16, 2004

Related U.S. Application Data
(60) Provisional application No. 60/348,426, filed on Oct. 26, 2001.

(51) Int. Cl.[7] .................. G03F 7/004; C08F 214/18; C08F 10/00
(52) U.S. Cl. ............... 430/270.1; 430/326; 430/907; 430/910; 526/242; 526/281; 526/245
(58) Field of Search ................ 430/270.1, 326, 430/907, 910; 526/281, 242, 245

(56) References Cited
U.S. PATENT DOCUMENTS

| 3,444,148 | A | 5/1969 | Adelman |
|---|---|---|---|
| 5,655,627 | A | 8/1997 | Horne et al. |
| 6,222,061 | B1 | 4/2001 | Jung |
| 6,794,109 | B1 * | 9/2004 | Fedynyshyn et al. ..... 430/270.1 |

FOREIGN PATENT DOCUMENTS

| JP | 62186907 A2 | 8/1987 |
|---|---|---|
| WO | WO 00/67072 | 11/2000 |
| WO | WO 02/44811 A2 | 6/2002 |
| WO | WO 02/44814 A2 | 6/2002 |

OTHER PUBLICATIONS

K. J. Przybilla et al., "Hexafluoroacetone in Resist Chemistry: A Versatile New Concept for Materials for Deep UV Lithography," SPIE, 1992, pp. 500–512, vol. 1672.

H. Ito et al., "Synthesis and Evaluation of Alicyclic Backbone Polymers for 193 nm Lithography," ACS Symposium Series 706 (Micro– and Nanopatterning Polymers), 1998, pp. 208–223, Chapter 16.

Davies et al., "Addition of Thiols to some 5–Substituted Norborn–2–enes," J. Chem. Soc., Perkin I, 1973, p. 433.

R. J. Hung, et al., Advances in Resist Technology and Processing XVIII, SPIE, pp. 385–395, vol. 4345, 2001.

Reddy et al., "Hexafluoroisopropoxy–Containing Polyacrylates," Polym. Prepr. Am. Chem. Soc., Div. Polym. Chem., 1993, pp. 435–436, vol. 34, Issue 1.

E. Reichmanis et al., "The Effect of Substituents on the Photosensitivity of 2–Nitrobenzyl Ester Deep U.V. Resists," J. Electrochem. Soc., vol. 130, 1983, pp. 1433–1437.

Stefan Breunig, "Transition–metal catalyzed vinyl addition polymerizations of norbornene derivatives with ester groups," Makromol. Chem. 193, 1992, pp. 2915.

Okoroanyanwu, et al., "Pd(II)–catalyzed addition polymerization and ring opening metathesis polymerization of alicyclic monomers: routes to new matrix resins for 193 nm photolithography," J. Mol. Catal. A Chemical 133, 1998, p. 93.

A. Reinmuth, et al., "(n3–Allyl)palladium(II) Catalysts for the Addition Polymerization of Norborene Derivatives with Functional Groups," Macromol. Rapid Commun. 17, 1996, p. 173.

G. H. Posner, et al., "Mechanistic and Synthetic Study of Organocopper Substitution Reactions with Some Homoallylic and Cyclopropylcarbinyl Substrates," Tetrahedron, 1976, p. 2281.

H. Ito et al., "Abstract in Polymeric Materials Science and Engineering Division," American Chemical Society Meeting, Fall Meeting, Sep. 8–11, 1997, pp. 449–450, vol. 77.

Dammel et al., "Transparent Resins for 157 nm Lithography," Advances in Resist Technology and Processing XVIII, SPIE, 2001, pp. 350–360, vol. 4345.

* cited by examiner

*Primary Examiner*—Rosemary Ashton

(57) ABSTRACT

Fluorinated polymers, photoresists and associated processes for microlithography are described. These polymers and photoresists are comprised of esters derived from fluoroalcohol functional groups that simultaneously impart high ultraviolet (UV) transparency and developability in basic media to these materials. The materials of this invention have high UV transparency, particularly at short wavelengths, e.g., 157 nm, which makes them highly useful for lithography at these short wavelengths.

37 Claims, No Drawings

FLUORINATED POLYMERS HAVING ESTER GROUPS AND PHOTORESISTS FOR MICROLITHOGRAPHY

This application claims the benefit of provisional application Ser. No. 60/348,426, filed Oct. 26, 2001.

BACKGROUND OF THE INVENTION

1. Field of the Invention

The present invention pertains to fluorine-containing polymer compositions having fluoroalcohol groups and ester groups, which have high UV transparency (particularly at short wavelengths, e.g., 157 and 193 nm) and which are useful as film forming resins in resists and potentially in many other applications.

2. Description of Related Art

Polymer products are used as components of imaging and photosensitive systems and particularly in photoimaging systems such as those described in *Introduction to Microlithography, Second Edition* by L. F. Thompson, C. G. Willson, and M. J. Bowden, American Chemical Society, Washington, D.C., 1994. In such systems, ultraviolet (UV) light or other electromagnetic radiation impinges on a material containing a photoactive component to induce a physical or chemical change in that material. A useful or latent image is thereby produced which can be processed into a useful image for semiconductor device fabrication.

Although the polymer product itself may be photoactive, generally a photosensitive composition contains one or more photoactive components in addition to the polymer product. Upon exposure to electromagnetic radiation (e.g., UV light), the photoactive component acts to change the rheological state, solubility, surface characteristics, refractive index, color, electromagnetic characteristics or other such physical or chemical characteristics of the photosensitive composition as described in the Thompson et al. publication supra.

For imaging very fine features at the submicron level in semiconductor devices, electromagnetic radiation in the far or extreme ultraviolet (UV) is needed. Positive working resists generally are utilized for semiconductor manufacture.

Lithography in the UV at 365 nm (I-line) using novolak polymers and diazonaphthoquinones as dissolution inhibitors is a currently established chip technology having a resolution limit of about 0.35–0.30 micron. Lithography in the far UV at 248 nm using p-hydroxystyrene polymers is known and has a resolution limit of approximately 0.18–0.13 $\mu$m. There is strong impetus for future photolithography at even shorter wavelengths, due to a decreasing lower resolution limit with decreasing wavelength (i.e., a resolution limit of approximately 0.13–0.10 $\mu$m for 193 nm imaging and a resolution limit of about 0.05 $\mu$m for 157 nm imaging).

Photolithography using 157 nm exposure wavelength (obtained from a fluorine excimer laser) is a leading candidate for future microlithography further out on the time horizon (beyond 193 nm), provided suitable materials can be found having sufficient transparency and other required properties at this very short wavelength. The opacity of traditional near UV and far UV organic photoresists at 193 nm or shorter wavelengths precludes their use in single-layer schemes at these short wavelengths.

Some resist compositions suitable for imaging at 193 nm are known. For example, photoresist compositions comprising cycloolefin-maleic anhydride alternating copolymers have been shown to be useful for imaging of semiconductors at 193 nm (see F. M. Houlihan et al, *Macromolecules*, 30, pages 6517–6534 (1997); T. Wallow et al., SPIE, Vol. 2724, pages 355–364; and F. M. Houlihan et al., *Journal of Photopolymer Science and Technology*, 10, No. 3, pages 511–520 (1997)). Several publications are focused on 193 nm resists (i.e., U. Okoroanyanwu et al., SPIE, Vol. 3049, pages 92–103; R. Allen et al., SPIE, Vol. 2724, pages 334–343; and Semiconductor International, September 1997, pages 74–80). Compositions comprising addition polymers and/or ROMP (ring-opening methathesis polymerization) of functionalized norbornenes have been disclosed (e.g., PCT WO 97/33198 (Sep. 12, 1997) to B. F. Goodrich). Homopolymers and maleic anhydride copolymers of norbornadiene and their use in 193 nm lithography have been disclosed (J. Niu and J. Frechet, Angew. Chem. Int. Ed., 37, No. 5, (1998), pages 667–670). Copolymers of fluorinated alcohol-substituted polycyclic ethylenically unsaturated comonomer and sulfur dioxide that are suitable for 193 nm lithography have been reported (see H. Ito et al., "Synthesis and Evaluation of Alicyclic Backbone Polymers for 193 nm Lithography," Chapter 16, ACS Symposium Series 706 (Micro- and Nanopatterning Polymers) pages 208–223 (1998), and H. Ito et al., Abstract in Polymeric Materials Science and Engineering Division, American Chemical Society Meeting, Volume 77, Fall Meeting, Sep. 8–11,1997, held in Las Vegas, Nev.) Because of the presence of repeat units derived from sulfur dioxide in this alternating copolymer, it is not suitable for 157 nm lithography due to the excessively high absorption coefficient of this polymer at 157 nm.

Photoresists containing fluorinated alcohol functional groups attached to aromatic moieties have been disclosed (see K. J. Przybilla et al., "Hexafluoroacetone in Resist Chemistry: A Versatile New Concept for Materials for Deep UV Lithography," SPIE Vol. 1672, (1992), pages 500–512). While suitable for 248 nm lithography, these resists may be unsuitable for lithography at 193 or 157 nm at film thicknesses of greater than about 150 nm (due to the high absorption coefficients of the aromatic resist components at these wavelengths).

Copolymers of fluoroolefin monomers and cyclic unsaturated monomers are known (U.S. Pat. Nos. 5,177,166 and 5,229,473 to Daikin Industries, Ltd.). These patents do not disclose the use of these copolymers in any photosensitive compositions. Copolymers of certain fluorinated olefins with certain vinyl esters are known. For example, the copolymer of TFE with cyclohexanecarboxylate, vinyl ester is known (Japanese Patent Appl. JP 03281664 to Dainippon Ink and Chemicals). Copolymers of TFE and vinyl esters, such as vinyl acetate, and use of these copolymers in photosensitive compositions for refractive index imaging (e.g., holography) is known (U.S. Pat. No. 4,963,471 to DuPont). Copolymers of norbornene-type monomers containing functional groups with ethylene have been disclosed previously (WO/56837 to B. F. Goodrich), as have copolymers of norbornene-type monomers containing functional groups with vinyl ethers, dienes, and isobutylene (U.S. Pat. No. 5,677,405 to B. F. Goodrich).

Certain copolymers of fluorinated alcohol comonomers with other comonomers have been reported in U.S. Pat. No. 3,444,148 and JP 62186907 A2 patent publication. These patents are directed to membrane or other non-photosensitive films or fibers, and neither has any teaching of fluorinated alcohol comonomers for use in photosensitive layers (e.g., resists).

Polymers derived from monomers with the structure:

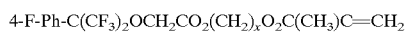

wherein x is 2 or 3 are disclosed by Reddy et al. ("Polyacrylates Containing the Hexafluoroisopropylidene Function in the Pendant Groups" in *Fluoropolymers 1 Synthesis*, Hougham et al., ed. Kluwer Academic/Plenum Publishers, New York 1999, pages 3 to 9) and by Reddy et al. (Polym. Prepr. (Am. Chem. Soc., Div Polym. Chem.) Vol. 34, issue 1, pages 435–436, 1993). There is no teaching that these polymers can be used in photosensitive layers (e.g., resists), and the presence of the aromatic functionality contained in them render them unsuitable for lithography at 193 or 157 nm (due to the excessively high absorption coefficients of the aromatic components at these wavelengths).

U.S. Pat. No. 5,655,627 discloses a process for generating a negative tone resist image by coating a silicon wafer with a copolymer resist solution of pentafluoropropyl methacrylate-t-butyl methacrylate in a solvent, and then exposing at 193 nm and developing with a carbon dioxide critical fluid. This composition may have poor resistance to plasma etch conditions due to the absence of aromatic and/or polycyclic units.

Vinyl addition copolymers of norbornene-fluoroalcohols that contain esters, and that are useful as 193 and 157 nm photoresists have been disclosed in PCT WO0067072; Sakamuri, et al., Advances in Resist Technology and Processing XVIII, SPIE Vol. 4345, (2001); and R. J. Hung, et al., Advances in Resist Technology and Processing XVIII, SPIE Vol. 4345, (2001). Vinyl addition copolymers of this type have absorption coefficients of approximately 3 $\mu m^{-1}$, depending on how much ester group they contain.

A need still exists for resist compositions that satisfy the myriad of requirements for single layer photoresists that include optical transparency at 193 nm and/or 157 nm, plasma etch resistance, and solubility in an aqueous base developer.

There is also a need for polymers with novel functional groups that form novel resist compositions for use at 193 nm, and particularly at 157 nm, or lower that have not only high transparency at these short wavelengths but also suitable other key properties, including good plasma etch resistance and adhesive properties.

SUMMARY OF THE INVENTION

In a first aspect, the invention provides a fluorine-containing polymer comprising a functional group having the following structure:

—C($R_f$)($R_f^1$)OCH$_2$C(O)OR$_a$ wherein $R_f$ and $R_f^1$ are the same or different fluoroalkyl groups of from 1 to 10 carbon atoms, or taken together are (CF$_2$)$_n$, wherein n is 2 to 10 and R$_a$ is hydrogen or an acid- or base-labile protecting group, the fluorine-containing copolymer being substantially free of aromatic groups.

In the first aspect, the invention also provides a fluorine-containing polymer further comprising a repeat unit derived from at least one ethylenically unsaturated compound containing a functional group having the following structure:

—C($R_f^2$)($R_f^3$)OR$_b$ wherein $R_f^2$ and $R_f^3$ are the same or different fluoroalkyl groups of from 1 to 10 carbon atoms, or taken together are (CF$_2$)$_n$, wherein n is 2 to 10 and R$_b$ is hydrogen or an acid- or base-labile protecting group.

In the first aspect, the invention also provides a fluorine-containing polymer comprising the following three monomer units:

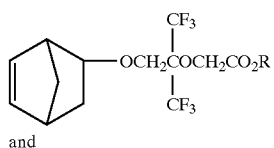

and

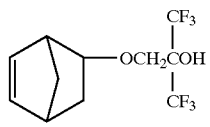

wherein R is a tertiary alkyl group, preferably containing from 4 to 25 carbon atoms, such as tert-butyl or 2-methyl-2-adamantyl to give a polymer with the following structure:

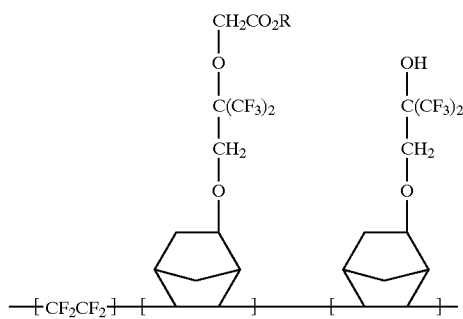

In the first aspect, the invention also provides a fluorine-containing polymer comprising the following two monomer units:

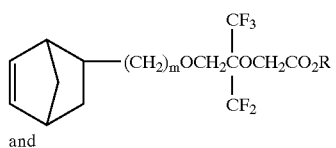

and

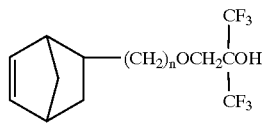

wherein R is as defined above and n and m are independently zero or one to give a polymer with the following structure:

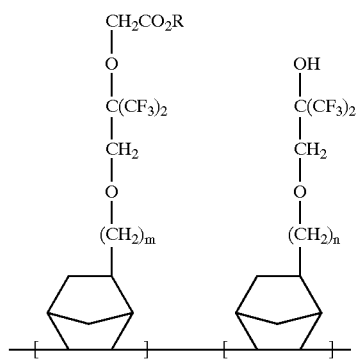

In a second aspect, the fluorine-containing polymer is prepared by reaction of at least one "unprotected" —C(CF$_3$)$_2$ OH group in the polymer with a halo-t-butyl acetate in the presence of base.

In this second aspect, the invention also provides a protected fluorine-containing polymer prepared by polymerizing the following monomer:

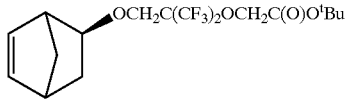

In a third aspect, the invention provides a photoresist composition comprising a fluorine-containing polymer comprising the structure:

wherein R$_f$ and R$_f^1$ are the same or different fluoroalkyl groups of from 1 to 10 carbon atoms, or taken together are (CF$_2$)$_n$, wherein n is 2 to 10 and R$_a$ is hydrogen or an acid- or base-labile protecting group, the fluorine-containing copolymer being substantially free of aromatic groups. The photoresist composition further comprises at least one photoactive component.

In the third aspect, this invention also provides a fluorine-containing copolymer comprising repeat units derived from:
a. at least one ethylenically unsaturated compound which comprises a cyclic group or a polycyclic group; and
b. at least one ethylenically unsaturated compound which comprises a fluorine atom covalently attached to an ethylenically unsaturated carbon atom; and
c. a functional group having the structure:

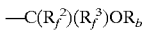

wherein R$_f^2$ and R$_f^3$ are the same or different fluoroalkyl groups of from 1 to 10 carbon atoms, or taken together are (CF$_2$)$_n$, wherein n is 2 to 10 and R$_b$ is a hydrogen or an acid- or base-labile protecting group. Such a copolymer may further comprise a repeat unit derived from CH$_2$=CHCO$_2$R$_c$ wherein R$_c$ is a tertiary alkyl group. The tertiary alkyl group can have from 4 to 25 carbon atoms, typically from 4 to 10 carbon atoms. Photoresist compositions containing such a copolymer are also contemplated.

In a fourth aspect, the invention provides a process for preparing a photoresist image on a substrate comprising, in order:
(a) forming a photoresist layer on a substrate from a photoresist composition, wherein the photoresist composition comprises a fluorine-containing polymer comprising the structure:

wherein R$_f$ and R$_f^1$ are the same or different fluoroalkyl groups of from 1 to 10 carbon atoms, or taken together are (CF$_2$)$_n$, wherein n is 2 to 10 and R$_a$ is hydrogen or an acid- or base-labile protecting group, the fluorine-containing polymer being substantially free of aromatic groups;
(b) imagewise exposing the photoresist layer to form imaged and non-imaged areas; and
(c) developing the exposed photoresist layer having imaged and non-imaged areas to form the photoresist image on the substrate.

The photoresist composition is applied to the substrate and is typically dried to form the photoresist layer. The photoresist composition further comprises at least one photoactive component and a solvent.

DETAILED DESCRIPTION OF THE PREFERRED EMBODIMENTS

Fluorine-Containing Polymer

A given fluorine-containing polymer or copolymer comprises a repeat unit (discussed infra) derived from at least one ethylenically unsaturated compound containing a functional group of the structure:

The fluoroalkyl groups designated as R$_f$ and R$_f^1$, can be partially fluorinated alkyl groups or fully fluorinated alkyl groups (i.e., perfluoroalkyl groups). Broadly speaking, R$_f$ and R$_f^1$ are the same or different fluoroalkyl groups of from 1 to about 10 carbon atoms, or taken together are (CF$_2$)$_n$, wherein n is 2 to 10. The terms "taken together" means that R$_f$ and R$_f^1$ are not separate, discrete fluorinated alkyl groups, but that together they form a ring structure such as is illustrated below in case of a 5-membered ring:

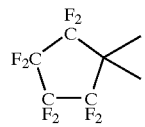

R$_f$ and R$_f^1$ can be partially fluorinated alkyl groups without limit according to the invention except that there must be a sufficient degree of fluorination such that a hydroxyl group attached to the C(R$_f$)(R$_f^1$) group would be sufficiently acidic that the hydroxylproton is substantially removed in basic media, such as in aqueous sodium hydroxide solution or tetraalkylammonium hydroxide solution. In preferred cases according to the invention, there will be sufficient fluorine substitution present in the fluorinated alkyl groups of the functional group such that the hydroxyl group will have a pKa value as follows: 5<pKa<11. Preferably, R$_f$ and R$_f^1$ are independently perfluoroalkyl group of 1 to 5 carbon atoms, and, most perferably, R$_f$ and R$_f^1$ are both trifluoromethyl (CF$_3$).

As is well known to those skilled in the polymer art, an ethylenically unsaturated compound undergoes free radical polymerization to afford a polymer having a repeat unit that is derived from the ethylenically unsaturated compound. Specifically, an ethylenically unsaturated compound having structure:

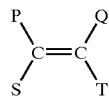

that undergoes free radical polymerization will afford a polymer having a repeat unit:

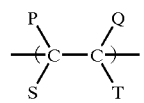

where P, Q, S, and T independently can be the same or different and illustratively could be fluorine, hydrogen, chlorine, and trifluoromethyl.

If only one ethylenically unsaturated compound undergoes polymerization, the resulting polymer is a homopolymer. If two or more distinct ethylenically unsaturated compounds undergo polymerization, the resulting polymer is a copolymer.

Some representative examples of ethylenically unsaturated compounds and their corresponding repeat units are given below:

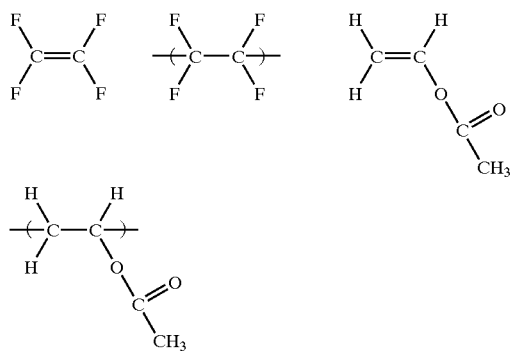

The fluorine-containing polymer, typically a homopolymer, copolymer, or terpolymer, according to this invention can have an absorption coefficient of less than 4.0 $\mu m^{-1}$ at a wavelength of 157 nm, preferably of less than 3.5 $\mu m^{-1}$ at this wavelength, more preferably, of less than 3.0 $\mu m^{-1}$ at this wavelength, and, still more preferably, of less than 2.5 $\mu m^{-1}$ at this wavelength.

The fluorinated polymers, photoresists, and processes of this invention may further comprise a functional group having the following structure:

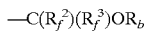

wherein $R_f^2$ and $R_f^3$ are the same or different fluoroalkyl groups of from 1 to 10 carbon atoms, or taken together are $(CF_2)_n$, wherein n is 2 to 10 and $R_b$ is a hydrogen or an acid- or base-labile protecting group.

The fluorinated polymers, photoresists, and processes of this invention may additionally comprise a fluorine-containing polymer comprising repeat units derived from:
a. at least one ethylenically unsaturated compound which comprises a cyclic group or a polycyclic group; and
b. at least one ethylenically unsaturated compound which comprises a fluorine atom covalently attached to an ethylenically unsaturated carbon atom; and
c. a functional group having the structure:

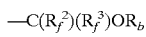

wherein $R_f^2$ and $R_f^3$ are the same or different fluoroalkyl groups of from 1 to 10 carbon atoms, or taken together are $(CF_2)_n$, wherein n is 2 to 10 and $R_b$ is a hydrogen or an acid- or base-labile protecting group. Such a copolymer may further comprise a repeat unit derived from $CH_2=CHCO_2R_c$, wherein $R_c$ is a tertiary alkyl group. The tertiary alkyl group can have from 4 to 25 carbon atoms, typically from 4 to 10 carbon atoms. In this embodiment, the preferred ethylenically unsaturated compound containing at least one fluorine atom covalently attached to an ethylenically unsaturated carbon atom is tetrafluoroethylene, the preferred $R_b$ is H, and $R_c$ is preferably tert-butyl or 2-methyl-2-adamantyl.

Some illustrative, but nonlimiting, examples of representative comonomers containing a fluoroalcohol functional group and within the scope of the invention are presented below:

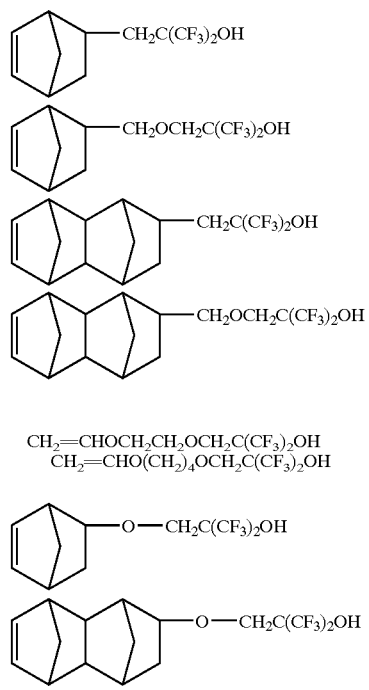

Polymers of the present invention may be obtained by known polymerization methods including batch, semicontinuous and continuous processes. Polymers comprising a repeat unit derived from a comonomer having at least one fluorine atom attached to an ethylenically unsaturated carbon atom may be prepared by free radical polymerization in bulk, solution, suspension or emulsion processes. Typical free radical initiators such as peroxydicarbonates or azo compounds, can be employed. Polymerization temperatures are chosen according to the reactivity of the initiator and typically range from about 20° C. to about 150° C. Preferred polymerization temperatures typically range from about 40° C. to about 90° C. Free radical polymerizations are generally performed in the absence of oxygen. A closed vessel may be employed to minimize the presence of oxygen and prevent evaporation of volatile monomers. For a solution process, a polymerization solvent is normally chosen which dissolves the monomers and the polymer being produced and which has a low tendency to undergo chain transfer. Preferred solvents include: chlorofluorocarbons, such as 1,1,2-trichlorotrifluoroethane; hydrofluorocarbons, such as 1,1,1,3,3-pentafluorobutane; hydrofluorocarbon ethers, such as methyl perfluorobutyl ether, esters, such as methyl acetate; tertiary aliphatic alcohols, such a tertiary butanol; and mixtures thereof. Polymer number average molecular weights (Mn) can be from about 2,000 to about 2,000,000 with preferred Mn ranging from about 2,000 to about 50,000 and most preferred Mn from about 3,000 to about 20,000. Molecular weights in free radical polymerizations are typically controlled by selecting the appropriate ratio of monomers to initiator or by inclusion of chain transfer agents.

Polymers comprising only repeat units derived from cyclic comonomers and lacking a repeat unit derived from a comonomer that has one or more fluorine atoms attached directly to an ethylenically unsaturated carbon atom may be prepared using transition metal catalysts which are well known in the art. Typically, catalysts are based on Ni(II) or Pd(II) (*Macromol. Rapid Commun.* 1996, 17, 173; *Makromol. Chem.* 1992; 193, 2915; *J. Mol. Catal. A: Chemical* 1998, 133, 93).

Photoactive Component (PAC)

The photoresist compositions of this invention typically contain at least one photoactive component (PAC) that usually is a compound that affords either acid or base upon exposure to actinic radiation. If an acid is produced upon exposure to actinic radiation, the PAC is termed a photoacid generator (PAG). If a base is produced upon exposure to actinic radiation, the PAC is termed a photobase generator (PBG).

Suitable photoacid generators for this invention include, but are not limited to, 1) sulfonium salts (structure I), 2) iodonium salts (structure II), and 3) hydroxamic acid esters, such as structure III.

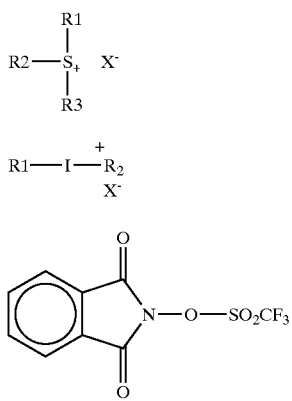

In structures I–II, $R_1$–$R_3$ are independently substituted or unsubstituted aryl or substituted or unsubstituted $C_1$–$C_{20}$ alkylaryl (aralkyl). Representative aryl groups include, but are not limited to, phenyl and naphthyl. Suitable substituents include, but are not limited to, hydroxyl (—OH) and $C_1$–$C_{20}$ alkyloxy (e.g., $C_{10}H_{21}O$). The anion $X^-$ in structures I–II can be, but is not limited to, $SbF_6^-$ (hexafluoroantimonate), $CF_3SO_3^-$ (trifluoromethylsulfonate=triflate), and $C_4F_9SO_3^-$ (perfluorobutylsulfonate). A typical photoacid generator is triphenyl-sulfonium nonaflate.

Protective Groups for Removal by PAC Catalysis

The fluorine-containing polymers of the resist compositions of this invention may contain one or more components having protected acidic fluorinated alcohol groups and/or other acid groups that can yield, by catalysis of acids or bases generated photolytically from photoactive compounds (PACs), hydrophilic acid groups which enable development of resist coatings. A given protected acid group is one that is normally chosen on the basis of its being acid labile, such that when photoacid is produced upon imagewise exposure, the acid will catalyze deprotection and production of hydrophilic acid groups that are necessary for development under aqueous conditions. In addition, the fluorine-containing polymers may also contain acid functionality that is not protected.

Examples of components having protected acidic groups that yield an acidic group as the hydrophilic group upon exposure to photogenerated acid include, but are not limited to: A) esters capable of forming, or rearranging to, a tertiary cation; B) esters of lactone; C) acetal esters; D) γ-cyclic ketone esters; E) γ-cyclic ether esters; F) MEEMA (methoxy ethoxy ethyl methacrylate) and other esters which are easily hydrolyzable because of anchimeric assistance; and G) carbonates formed from a fluorinated alcohol and a tertiary aliphatic alcohol. Some specific examples in category A) are t-butyl ester, 2-methyl-2-adamantyl ester, and isobornyl ester. Some specific examples in category B) are γ-butyrolactone-3-yl, γ-butyrolactone-2-yl, mavalonic lactone, 3-methyl-γ-butyrolactone-3-yl, 3-tetrahydrofuranyl, and 3-oxocyclohexyl. Some specific examples in category C) are 2-tetrahydropyranyl, 2-tetrahydrofuranyl, and 2,3-propylenecarbonate-1-yl. Additional examples in category C) include various esters from addition of vinyl ethers, such as, for example, ethoxy ethyl vinyl ether, methoxy ethoxy ethyl vinyl ether, and acetoxy ethoxy ethyl vinyl ether.

A given protected fluorinated alcohol group and/or other acid group (as referenced supra) contains a protecting group which protects the fluorinated alcohol group and/or other acid group (i.e., the protected group) from exhibiting its acidity while in this protected form. As one illustrative example, the tertiary-butyl group is the protecting group in a tertiary-butyl ester and this protecting group protects the free acid. Upon undergoing deprotection (conversion of protected acid to free acid), the ester is converted to the corresponding acid.

In this invention, often, but not always, the components having protected groups are repeat units having protected acid groups that have been incorporated in the base copolymer resins of the compositions (as discussed supra). Frequently, the protected acid groups are present in one or more comonomers that are polymerized to form a given copolymeric base resin of this invention. Alternatively, in this invention, a copolymeric base resin can be formed by copolymerization with an acid-containing comonomer. Subsequently, acid functionality in the resulting acid-containing copolymer can be partially or wholly converted by appropriate means to derivatives having protected acid groups.

An example of a fluorine-containing polymer having the fluoro groups, as defined above, is represented by the following structure:

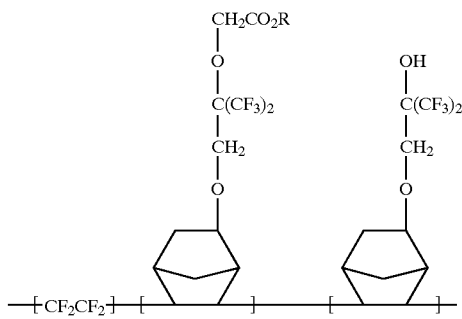

This "structure" merely indicates the presence of three different types of monomer units, not that the monomer units appear in the polymer in this sequential arrangement, nor that the ratio of monomer units is 1:1:1.

Another example of a fluorine-containing polymer having the fluoro group as defined above is represented by the following structure:

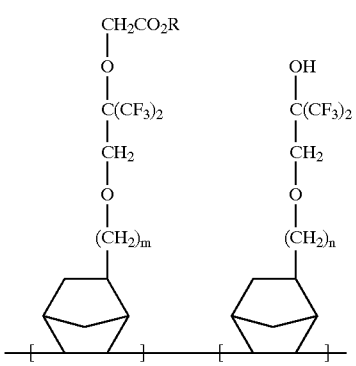

wherein R is an alkyl group, typically a tertiary alkyl group, of 4 to 25 carbon atoms, such as tert-butyl or 2-methyl-2-adamantyl, and m and n are independently zero or one. Again, this "structure" merely indicates the presence of three different types of monomer units, not that the monomer units appear in the polymer in this sequential arrangement, nor that the ratio of monomer units is 1:1:1.

The protected fluorine-containing polymer may be prepared by reaction of at least one "unprotected"—C(CF$_3$)$_2$OH group in the polymer with a bromo-t-butyl acetate in the presence of base. Alternatively, the starting monomer used in the polymer synthesis can contain the "protected" fluroalcohol group. For example, the above copolymers can be made by including the norbornene monomer below as one of the comonomers:

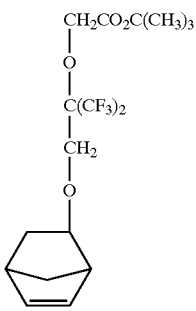

This monomer may be prepared by reaction of the norbornene fluoroalcohol monomer with an α-haloacetate, typically an alkyl acetate in which the alkyl group contains 4 to 25 carbon atoms. An example of a useful alkyl acetate is tert-butyl bromoacetate. The reaction is illustrated in the equation below.

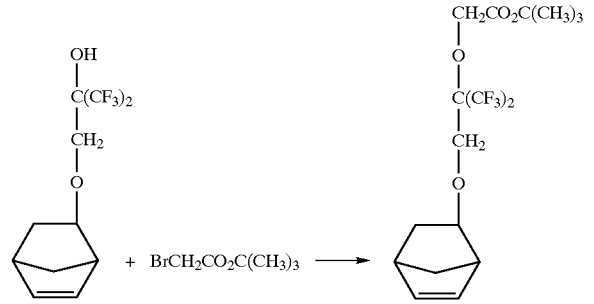

Dissolution Inhibitors

Various dissolution inhibitors can be utilized in this invention. Ideally, dissolution inhibitors (DIs) for far and extreme UV resists (e.g., 193 nm resists) should be designed/chosen to satisfy multiple materials needs including dissolution inhibition, plasma etch resistance, and adhesion behavior of resist compositions comprising a given DI additive. Some dissolution inhibiting compounds also serve as plasticizers in resist compositions.

A variety of bile-salt esters (i.e., cholate esters) are particularly useful as DIs in the compositions of this invention. Bile-salt esters are known to be effective dissolution inhibitors for deep UV resists, beginning with work by Reichmanis et al. in 1983. (E. Reichmanis et al., "The Effect of Substituents on the Photosensitivity of 2-Nitrobenzyl Ester Deep UV Resists", J. Electrochem. Soc. 1983, 130, 1433–1437.) Bile-salt esters are particularly attractive choices as DIs for several reasons, including their availability from natural sources, their possessing a high alicyclic carbon content, and particularly for their being transparent in the deep and vacuum UV regions of the electromagnetic spectrum (e.g., typically they are highly transparent at 193 nm). Furthermore, the bile-salt esters are also attractive DI choices since they may be designed to have widely ranging hydrophobic to hydrophilic compatibilities depending upon hydroxyl substitution and functionalization.

Representative bile-acids and bile-acid derivatives that are suitable as additives and/or dissolution inhibitors for this invention include, but are not limited to, those illustrated below, which are as follows: cholic acid (IV), deoxycholic acid (V), lithocholic acid (VI), t-butyl deoxycholate (VII), t-butyl lithocholate (VIII), and t-butyl-3-α-acetyl lithocholate (IX). Bile-acid esters, including compounds VII–IX, are preferred dissolution inhibitors in this invention.

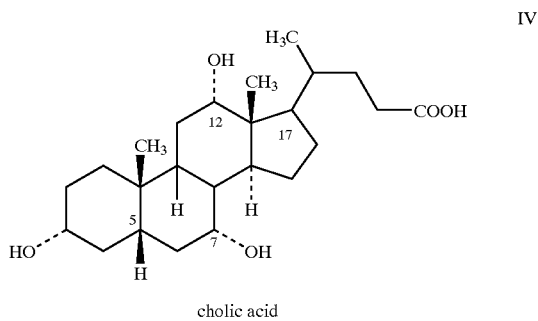

cholic acid

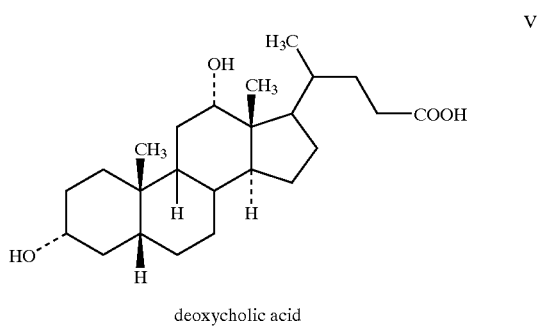

deoxycholic acid

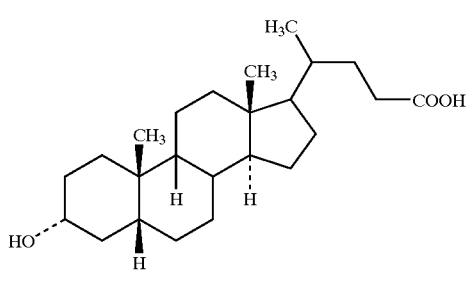

lithocholic acid

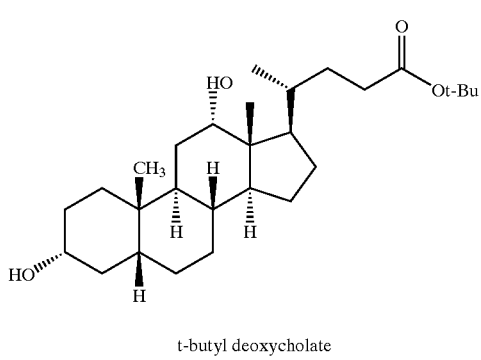

t-butyl deoxycholate

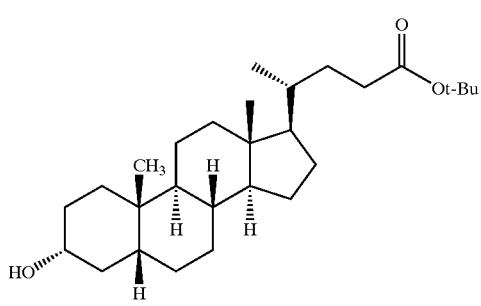

t-butyl lithocholate

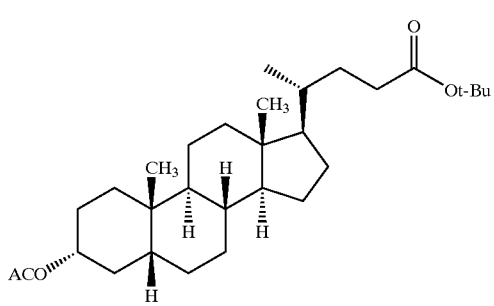

t-butyl-3α–acetyl lithocholate

Positive-Working and Negative-Working Photoresists

The photoresists of this invention can either be positive-working photoresists or negative-working photoresists, depending upon choice of components in the fluoropolymer, presence or absence of optional dissolution inhibitor and crosslinking agents, and the choice of developer (solvent used in development). In positive-working photoresists, the resist polymer becomes more soluble and/or dispersible in a solvent used in development in the imaged or irradiated areas. In a negative-working photoresist, the resist polymer becomes less soluble and/or dispersible in the imaged or irradiated areas. In one preferred embodiment of this invention, irradiation causes the generation of acid or base by the photoactive component discussed above. The acid or base may catalyze removal of protecting groups from functional group represented by the structure —C(R$_f$)(R$_f^1$)OCH$_2$C(O)OR$_a$ wherein R$_f$ and R$_f^1$ are as defined above, and optionally other acidic groups are present in a fluorine-containing polymer.

Development in an aqueous base such as tetramethylammonium hydroxide would result in the formation of a positive image whereas development in an organic solvent or critical fluid (having moderate to low polarity), would result in a negative-working system in which exposed areas remain and unexposed areas are removed. Positive-working photoresists are preferred.

A variety of different crosslinking agents can be employed as required or optional photoactive component(s) in the negative-working mode of this invention. (A crosslinking agent is required in embodiments that involve insolubilization in developer solution as a result of crosslinking, but is optional in preferred embodiments that involve insolubilization in developer solution as a result of polar groups being formed in exposed areas that are insoluble in organic solvents and critical fluids having moderate to low polarity). Suitable crosslinking agents include, but are not limited to, various bis-azides, such as 4,4'-diazidodiphenyl sulfide and 3,3'-diazidodiphenyl sulfone. Preferably, a negative-working resist composition containing one or more crosslinking agents also contains suitable functionality (e.g., unsaturated C=C bonds) that can react with the reactive species (e.g., nitrenes) that are generated upon exposure to UV. This reaction produces crosslinked polymers that are not soluble, dispersed, or substantially swollen in developer solution, which consequently imparts negative-working characteristics to the composition.

Other Components

The compositions of this invention can contain optional additional components. Examples of additional components which can be added include, but are not limited to, resolution enhancers, adhesion promoters, residue reducers, coating aids, plasticizers, and T$_g$ (glass transition temperature) modifiers.

Method of Making the Photoresist Composition

The photoresist composition of this invention is made by mixing together an amount of the fluorine containing polymer as described herein with a suitable amount of solvent, dissolution inhibitor and any other suitable additives. Solvent is typically employed in an amount suitable to make a film-forming coating of the photoresist composition on the substrate.

Some examples of suitable solvents include 2-heptanone; Propylene glycol methyl ether acetate (PGMEA); chlorobenzene; ethyl ketone; propylene carbonate; cyclohexanone; methyl isobutyl ketone; supercritical CO$_2$; 2,3-dihydroperfluoropentane, t-butyl alcohol; methyl acetate; THF; methyl alcohol; 1,1,2-trichlorotrifluoroethane; isopropyl alcohol; methylene chloride; acetone; methyl ethyl ketone; acetonitrile; ethyl lactate; and mixtures thereof.

Process Steps:

The photoresist layer is deposited on a substrate by, for example, spin coating a photoresist composition of this invention. The photoresist composition is then dried to remove the solvent and form the photoresist layer.

Imagewise Exposure

The photoresist compositions of this invention are sensitive in the ultraviolet region of the electromagnetic spectrum and especially to those wavelengths ≦365 nm. Imagewise exposure of the resist compositions of this invention can be done at many different UV wavelengths including, but not limited to, 365 nm, 248 nm, 193 nm, 157 nm, and lower wavelengths. Imagewise exposure is preferably done with ultraviolet light of 248 nm, 193 nm, 157 nm, or lower wavelengths; preferably it is done with ultraviolet light of 193 nm, 157 nm, or lower wavelengths, and most preferably, it is done with ultraviolet light of 157 nm or lower wavelengths. Suitable laser devices for digital imaging of the compositions of this invention include, but are not limited to, an argon-fluorine excimer laser with UV output at 193 nm, a krypton-fluorine excimer laser with UV output at 248 nm, and a fluorine (F2) laser with output at 157 nm. Since, as discussed supra, use of UV light of lower wavelength for imagewise exposure corresponds to higher resolution (lower resolution limit), the use of a lower wavelength (e.g., 193 nm or 157 nm or lower) is generally preferred over use of a higher wavelength (e.g., 248 nm or higher).

Development

The fluorine-containing polymers In the resist compositions of this invention must contain sufficient functionality for development following imagewise exposure to UV light. Preferably, the functionality is a protected acid group, such that aqueous development is possible using a basic developer such as sodium hydroxide solution, potassium hydroxide solution, or ammonium hydroxide solution. The level of protecting groups is usually determined for the polymer of a given photoresist composition by optimizing the amount needed for good development in aqueous alkaline developer.

When an aqueous processable photoresist is coated or otherwise applied to a substrate and imagewise exposed to UV light, development of the photoresist composition may require that the binder material contain sufficient protected acid groups that are at least partially deprotected upon exposure to render the photoresist (or other photoimageable coating composition) processable in aqueous alkaline developer. In case of a positive-working photoresist layer, the photoresist layer will be removed during development in portions which are exposed to UV radiation but will be substantially unaffected in unexposed portions during development by aqueous alkaline liquids such as wholly aqueous solutions containing 0.262 N tetramethylammonium hydroxide (with development at 25° C. usually for less than or equal to 120 seconds). In case of a negative-working photoresist layer, the photoresist layer will be removed during development in portions which are unexposed to UV radiation but will be substantially unaffected in exposed portions during development using either a critical fluid or an organic solvent.

A critical fluid, as used herein, is a substance or mixture of substances heated to a temperature near or above its critical temperature and compressed to a pressure near or above its critical pressure. Critical fluids in this invention are at a temperature that is higher than 15° C. below the critical temperature of the fluid and are at a pressure higher than 5 atmospheres below the critical pressure of the fluid. Carbon dioxide may be used for the critical fluid in the present invention. Various organic solvents can also be used as developer in this invention. These include, but are not limited to, halogenated solvents and non-halogenated solvents. Halogenated solvents are preferred and fluorinated solvents are more preferred.

Substrate

The substrate employed in this invention can illustratively be silicon, silicon oxide, silicon nitride, or various other materials used in semiconductor manufacture.

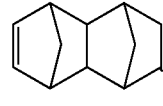

| GLOSSARY | |
|---|---|
| Analytical/Measurements | |
| bs | broad singlet |
| — | NMR chemical shift measured in the indicated solvent |
| g | gram |
| NMR | Nuclear Magnetic Resonance |
| $^1$H NMR | Proton NMR |
| $^{13}$C NMR | Carbon-13 NMR |
| $^{19}$F NMR | Fluorine-19 NMR |
| s | singlet |
| sec. | second(s) |
| m | multiplet |
| mL | milliliter(s) |
| mm | millimeter(s) |
| μm | micron(s) |
| $T_g$ | Glass Transition Temperature |
| $M_n$ | Number-average molecular weight of a given polymer |
| Mw | Weight-average molecular weight of a given polymer |
| $P = M_w/M_n$ | Polydispersity of a given polymer |
| Absorption coefficient | AC = A/b, where A, absorbance, = $Log_{10}(1/T)$ and b = film thickness in microns, where T = transmittance as defined below. |
| Transmittance | Transmittance, T, = ratio of the radiant power transmitted by a sample to the radiant power incident on the sample and is measured for a specified wavelength (e.g., nm). |
| Chemicals/Monomers | |
| AA | Acrylic acid<br>Aldrich Chemical Co., Milwaukee, WI |
| AIBN | 2,2'-azobisisobutyronitrile<br>Aldrich Chemical Co., Milwaukee, WI |
| CFC-113 | 1,1,2-Trichlorotrifluoroethane<br>(E. I. du Pont de Nemours and Company, Wilmington, DE) |
| HFIBO | Hexafluoroisobutylene epoxide<br>Aldrich Chemical Co., Milwaukee, WI |
| MEK | 2-Butanone<br>Aldrich Chemical Co., Milwaukee, WI |
| Perkadox ® 16 N | Di-(4-tert-butylcyclohexyl)peroxydicarbonate<br>Noury Chemical Corp., Burt, NY |
| PGMEA | Propylene glycol methyl ether acetate<br>Aldrich Chemical Co., Milwaukee, WI |
| TBA | Tertiary-Butyl acrylate |
| TCB | Trichlorobenzene<br>Aldrich Chemical Co., Milwaukee, WI |
| TCDD-CO$_2^t$Bu | Tetracyclododecenylcarboxylic acid tert-butyl ester = |
| TFE | Tetrafluoroethylene<br>(E. I. du Pont de Nemours and Company, Wilmington, DE) |
| THF | Tetrahydrofuran<br>Aldrich Chemical Co., Milwaukee, WI |
| Vazo ® 52 | 2,4-Dimethyl-2,2'-azobis(pentanenitrile)<br>(E. I. du Pont de Nemours and Company, Wilmington, DE) |
| NB-F—O-t-BuAc | 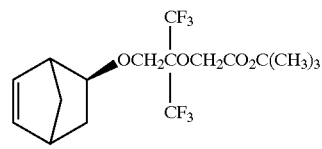 |

-continued

GLOSSARY

| | |
|---|---|
| NB-Me-F—O-t-BuAc | 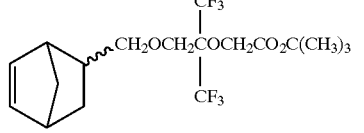 |
| NB-Me-OH | X = OH |
| NB-Me-F—OH | X = OCH$_2$C(CF$_3$)$_2$OH |
| NB-Me-F—OMOM | X = OCH$_2$C(CF$_3$)$_2$OCH$_2$OCH$_3$ |

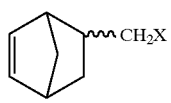

| | |
|---|---|
| NB-OAc | X = OCOCH$_3$ |
| NB-OH | X = OH |
| NB-F—OH | X = OCH$_2$C(CF$_3$)$_2$OH |
| NB-F—OMOM | X = OCH$_2$C(CF$_3$)$_2$OCH$_2$OCH$_3$ |

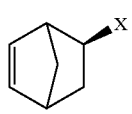

| | |
|---|---|
| VE-F—OH | CH$_2$=CHOCH$_2$CH$_2$OCH$_2$C(CF$_3$)$_2$OH |
| VE-F—OMOM | CH$_2$=CHOCH$_2$CH$_2$OCH$_2$C(CF$_3$)$_2$OCH$_2$OCH$_3$ |
| Ultraviolet | |
| Extreme UV | Region of the electromagnetic spectrum in the ultraviolet that ranges from 10 nanometers to 200 nanometers |
| Far UV | Region of the electromagnetic spectrum in the ultraviolet that ranges from 200 nanometers to 300 nanometers |
| UV | Ultraviolet region of the electromagnetic spectrum which ranges from 10 nanometers to 390 nanometers |
| Near UV | Region of the electromagnetic spectrum in the ultraviolet that ranges from 300 nanometers to 390 nanometers |

EXAMPLES

Unless otherwise specified, all temperatures are in degrees Celsius, all mass measurements are in grams, and all percentages are weight percentages.

Unless otherwise indicated, n, appearing within structure (s) given in the examples, represents the number of repeat units in the polymer. Throughout the specification, p, appearing within structure(s), represents the number of repeat units In the polymer.

Inherent viscosities were measured using a Cannon Auto-Visc II automated viscosity system (Cannon Instrument Company, State College, Pa. 16804) in the indicated solvents, generally at 35° C. and 1% concentration, and are reported in units of dL/g. Glass transition temperatures ($T_g$) were determined by DSC (differential scanning calorimetry) using a heating rate of 20° C./min, data is reported from the second heat. The DSC unit used is a Model DSC2910 made by TA Instruments, Wilmington, Del.

Assessment of 157 nm imaging sensitivity was done using a Lambda-Physik Compex 102 excimer laser configured for 157 nm operation. Vacuum ultraviolet transmission measurements were made using a McPherson spectrometer equipped with a D2 light source. Samples were spin-coated at several thicknesses on CaF$_2$ substrates, and the contribution of the substrate to the transmission was approximately removed by spectral division.

More specifically, all absorption coefficient measurements for polymers prepared in Examples 1 to 12 were made using the procedure listed below.

1. Samples were first spin-coated on silicon wafers on a Brewer Cee (Rolla, Mo.), Spincoater/Hotplate model 100CB.

a) Two to four silicon wafers were spun at different speeds (e.g., 2000, 3000, 4000, 6000 rpm) to obtain differing film thickness and the coated wafers were subsequently baked at 120° C. for 30 min. The dried films were then measured for thickness on a Gaertner Scientific (Chicago, Ill.), L116A Ellipsometer (400 to 1200 angstrom range). Two spin speeds were then selected from this data to spin the CaF$_2$ substrates for the spectrometer measurement.

b) Two CaF$_2$ substrates (1" dia.×0.80" thick) were selected and each was run as a reference data file on a McPherson Spectrometer (Chemsford, Mass.), 234/302 monochrometer, using a 632 Deuterium Source, 658 photomultiplier, and Keithley 485 picoammeter.

c) Two speeds were selected from the silicon wafer data a) to spin the sample material onto the CaF$_2$ reference substrates (e.g., 2000 and 4000 rpm) to achieve the desired film thickness. Then each was baked at 120° C. for 30 min. and the sample spectra was collected on the McPherson Spectrometer; the sample files were then divided by the reference CaF$_2$ files.

d) The resulting absorbance files were then adjusted (sample film on CaF$_2$ divided by CaF$_2$ blank) for film thickness to give absorbance per micron (abs/mic), which was done using GRAMS386 and KALEIDAGRAPH software.

The term "clearing dose" indicates the minimum exposure energy density (e.g., in units of mJ/cm$^2$) to enable a given photoresist film, following exposure, to undergo development.

NB—OAc and NB—OH were prepared as described by Posner et al. Tetrahedron, vol. 32, page 2281 (1976) and Davies et al. J. Chem. Soc. Perkin I, page 433 (1973).

Example 1

Synthesis of NB—F—OH

A dry round bottom flask equipped with mechanical stirrer, addition funnel and nitrogen inlet was swept with nitrogen and charged with 19.7 g (0.78 mol) of 95% sodium hydride and 500 mL of anhydrous DMF. The stirred mixture was cooled to 5° C. and 80.1 g (0.728 mol) of exo-5-norbornen-2-ol was added dropwise so that the temperature remained below 15° C. The resulting mixture was stirred for ½ hr. HFIBO (131 g, 0.728 mol) was added dropwise at room temperature. The resulting mixture was stirred overnight at room temperature. Methanol (40 mL) was added and most of the DMF was removed on a rotary evaporator under reduced pressure. The residue was treated with 200 mL water and glacial acetic acid was added until the pH was about 8.0. The aqueous mixture was extracted with 3×150 mL ether. The combined ether extracts were washed with 3×150 mL water and 150 mL brine, dried over anhydrous sodium sulfate and concentrated on a rotary evaporator to an oil. Kugelrohr distillation at 0.15–0.20 torr and a pot temperature of 30–60° C. gave 190.1 (90%) of product. $^1$H NMR (δ, CD$_2$Cl$_2$) 1.10–1.30 (m, 1H), 1.50 (d, 1H), 1.55–1.65 (m, 1H), 1.70 (s, 1H), 1.75 (d, 1H), 2.70 (s, 1H), 2.85 (s, 1H), 3.90 (d, 1H), 5.95 (s, 1H), 6.25 (s, 1H). Another sample prepared in the same fashion was submitted for elemental analysis. Calcd. for C$_{11}$H$_{12}$F$_6$O$_2$: C, 45.53; H, 4.17; F, 39.28. Found: C, 44.98; H, 4.22; F, 38.25.

Example 2

Copolymer of NB—F—OH and TFE

A 200 mL pressure vessel was charged with 58.0 g (0.20 mol) of NB—F—OH, 75 mL of 1,1,2- trichlorotrifluoroethane and 0.8 g of Perkadox® 16N. The vessel was closed, cooled in dry ice, evacuated and charged with 30 g (0.30 mol) of TFE. The vessel contents were heated with agitation to 50° C. and maintained for 18 hr. The vessel was cooled to room temperature and vented. The polymer solution was added slowly to a tenfold excess of hexane while stirring. The precipitate was filtered and dried in a vacuum oven at 100° C. to give 7.1 g of polymer. $^1$H NMR ((δ, THF-d8) 1.0–3.0 (m, 8H), 3.3–4.1 (m, 3H), 6.8 (m, 1H). $^{19}$F NMR ((δ, THF-d8) −75.6 (s, CF$_3$), −95 to −125 (m, CF$_2$). DSC: T$_g$=142° C. Anal. Found: C, 42.13; H, 3.62; F, 45.14. The polymer dissolved in 0.26 M aqueous tetramethylammonium hydroxide. A 5 wt % solution of the polymer in 2-heptanone was made for spin-coating, film samples were spin coated, and the absorption coefficient at 157 nm was determined to be 1.27 $\mu$m$^{-1}$ at a film thickness of 67.5 nm and 1.40 $\mu$m$^{-1}$ at a film thickness of 52.3 nm, indicating that the polymer is a highly transparent material.

Example 3

Homopolymer of NB-Me-F—OH

Under nitrogen, 0.19 g (0.49 mmol) of the allyl palladium complex [(η$^3$-MeCHCHCH$_2$)PdCl]$_2$ and 0.34 g (0.98 mmol) silver hexafluoroantimonate were suspended in chlorobenzene (40 mL). The resulting mixture was stirred at room temperature for 30 minutes. It was then filtered to remove precipitated AgCl, and an additional 10 mL chlorobenzene added. The resulting solution was added to 15.0 g (49.0 mmol) of NB-Me-F—OH. The resulting reaction mixture was stirred for three days at room temperature. The crude product polymer was isolated by precipitation in hexane. This material was taken up in acetone to give a 10 weight % solution, and filtered through a 0.2 $\mu$m Teflon® filter; the acetone filtrate was then concentrated to dryness, affording 7.8 g of addition copolymer. GPC: M$_n$=10352; M$_w$=19741; M$_w$/M$_n$=1.91. Anal. Found: C, 46.28; H, 4.81; F, 34.22. $^1$H NMR (CD$_2$Cl$_2$) of the polymer was consistent with the saturated vinyl-addition polymer shown below:

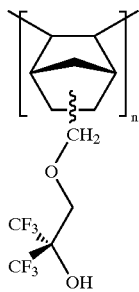

Example 4

Homopolymer of NB—F—OH

Using a procedure analogous to that described in Example 3, the 100% exo norbornene fluoroalcohol NB—F—OH was polymerized to give a 32% yield. $^1$H NMR (acetone-d$_6$) of the polymer was consistent with the saturated vinyl-addition polymer shown below:

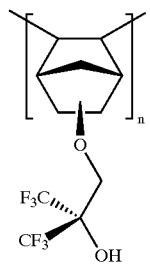

GPC: M$_n$=13975; M$_w$=183026; M$_w$/M$_n$=13.1.

Example 5

Synthesis of NB—F—O-t-BuAc

A 1-L round bottom flask with mechanical stirrer and reflux condenser was charged with 66.24 g (0.48 mol) anhydrous potassium carbonate, 500 mL acetonitrile and 126 g (0.43 mol) of NB—F—OH. The mixture was stirred and heated at reflux for 0.5 hr. tert-Butyl bromoacetate (Aldrich Chemical Company) (78 g, 0.4 mol) was added and this mixture was heated at reflux for 3 hr. The mixture was cooled to room temperature, filtered and concentrated to 165 g of oil on a rotary evaporator. Distillation of the oil afforded 122.3 g (76%) of product, bp 89–102° C. at 0.4 mm. $^1$H NMR (δ, acetone-d$_6$) 1.2–1.6 (m) and 1.35 (s) (13H), 2.68 (s, 1H), 2.85 (s, 1H), 3.47 (m, 1H), 4.04 (q, 2H), 4.40 (s, 2H), 5.80 (m, 1H), 6.10 (m, 1H). $^{19}$F NMR (δ, acetone-d$_6$) −73.3 (s).

Example 6

Synthesis of a TFE/NB—F—OH/NB—F—O-t-BuAc Copolymer by Polymer Modification

A 500 mL round bottom flask with mechanical stirrer, addition funnel and reflux condenser was charged with 23.4 g of a TFE/NB—F—OH copolymer which was calculated to contain 0.06 mol of hexafluoroisopropanol groups, 125 mL of acetonitrile and 9.94 g (0.072 mol) of potassium carbonate. This mixture was refluxed for 0.5 hr. tert-Butyl bromoacetate (Aldrich Chemical Company) (5.85 g, 0.03 mol) was added dropwise and the resulting mixture was refluxed for 4 hr. The mixture was cooled to room temperature and poured into 2 L of water giving a hazy solution. Aqueous hydrochloric acid was added dropwise until the solution pH was 1–2. A precipitate that formed was filtered and washed with water until the washings were neutral and allowed to air dry. The product was dissolved in ether and washed with 1% aqueous hydrochloric acid and with 100 mL of saturated sodium bicarbonate. The latter washing resulted in formation of an emulsion so aqueous hydrochloric acid was added to a pH of about 2. The ether phase was separated, dried over anhydrous magnesium sulfate and concentrated on a rotary evaporator. The solid was dissolved in THF and mixed with 10 mL of 18% aqueous hydrochloric acid. This mixture was poured into 3 L of water. The precipitate that formed was filtered, washed with water until the washings were neutral and dried in a vacuum oven to give 21.9 g of polymer. $^{19}$F NMR (δ, acetone-d$_6$) −74.2 (s, assigned to units from the NB—F—O-t-BuAc), −76.9 (s, assigned to units from NB—F—OH) and −95 to −125 (m, assigned to units from TFE). By integration of the spectrum, the composition of the polymer was found to be 46% TFE, 30% NB—F—OH and 24% NB—F—O-t-BuAc. Tg=132° C. by DSC. Samples of the polymer were spin coated from a 5% solution in 2-heptanone. The absorption coefficient at 157 nm was determined to be 2.43 $\mu m^{-1}$ at a film thickness of 55.4 nm and 2.84 $\mu m^{-1}$ at a film thickness of 47.7 nm.

Example 7

Terpolymer of TFE, NB—F—OH and NB—F—O-t-BuAc

A 200 mL pressure vessel was charged with 40.6 g (0.140 mol) of NB—F—OH, 42.4 g (0.105 mol) of NB—F—O-BuAc, 50 mL of 1,1,2-trichlorotrifluoroethane and 2.20 g of Perkadox® 16N. The vessel was closed, cooled in dry ice, evacuated and charged with 45.5 g (0.455 mol) of TFE. The vessel contents were heated with agitation to 50° C. and maintained for 18 hr. The vessel was cooled to room temperature and vented to 1 atmosphere. The polymer solution was added slowly to an excess of hexane while stirring. The precipitate was filtered, washed with hexane and dried in a vacuum oven. The resulting glassy solid was dissolved in a mixture of THF and 1,1,2-trichlorotrifluoroethane and added slowly to excess to hexane. The precipitate was filtered, washed with hexane and dried in a vacuum oven overnight to give 23.7 g of white polymer. $^{19}$F NMR ($\partial$, CDCl$_3$) −73.9 (s, assigned to units from the NB—F—O-t-BuAc), −76.9 (s, assigned to units from NB—F—OH) and −95 to −125 (m, assigned to units from TFE). By integration of the spectrum, the composition of the polymer was found to be 47% TFE, 30% NB—F—OH and 23% NB—F—O-t-BuAc. Tg=138° C. by DSC. Anal. Found: C, 43.61; H, 3.70; F, 40.98. Samples of the polymer were spin coated from a 5% solution in 2-heptanone. The absorption coefficient at 157 nm was determined to be 3.20 $\mu m^{-1}$ at a film thickness of 54.3 nm and 3.50 $\mu m^{-1}$ at a film thickness of 47.1 nm.

Example 8

Copolymer of TFE, NB—F—OH and tert-Butyl Acrylate (Batch Synthesis)

A 200 mL pressure vessel was charged with 48.7 g (0.168 mol) of NB—F—OH, 1.54 g (0.012 mol) tert-butyl acrylate, 75 mL of 1,1,2-trichlorotrifluoroethane and 0.6 g of Perkadox® 16N. The vessel was closed, cooled in dry ice, evacuated and charged with 42 g (0.42 mol) of TFE. The vessel contents were heated with agitation to 50° C. and maintained for 18 hr. The vessel was cooled to room temperature and vented to 1 atmosphere. The polymer solution was added slowly to an excess of hexane while stirring. The precipitate was filtered, washed with hexane and dried in a vacuum oven giving 10.7 g of white polymer. From its $^{13}$C NMR spectrum, the polymer composition was found to be 37% TFE, 47% NB—F—OH and 20% tert-butyl acrylate. DSC: Tg=142° C. GPC: Mn=5700; Mw=8400; Mw/Mn=1.47. Anal. Found: C, 44.13; H, 3.97; F, 40.11.

Example 9

Copolymer of TFE, NB—F—OH and tert-Butyl Acrylate (Semibatch Synthesis)

A metal pressure vessel of approximate 270 mL capacity was charged with 59.5 g NB—F—OH, 1.4 g tert-butyl acrylate and 30 mL 1,1,2-trichlorotrifluoroethane. The vessel was closed, cooled to about −15° C. and pressured to 400 psi with nitrogen and vented several times. TFE (48.5 g) was added and the vessel was heated to 50° C. When the temperature and pressure (about 325 psi) stabilized, a solution of 58.7 g of NB—F—OH and 17.3 g of tert-butyl acrylate diluted to 75 mL with 1,1,2-trichlorotrifluoroethane was pumped into the reactor at a rate of 0.07 mL/minute for 12 hr. Simultaneously with the monomer feed solution, a solution of 5.4 g Perkadox® 16N and 30–35 mL methyl acetate diluted to 75 mL with 1,1,2-trifluorotrichloroethane was pumped into the reactor at a rate of 2.0 mL/minute for 6 minutes, and then at a rate of 0.08 mL/minute for 8 hours. At 1, 2 and 3 hours after starting addition of the monomer feed solution, 2.5 g portions of TFE were added to the reactor. After a 16 hours reaction time, the vessel was cooled to room temperature and vented to 1 atmosphere. The recovered polymer solution was added slowly to an excess of hexane while stirring. The precipitate was filtered, washed with hexane and dried in a vacuum oven. The resulting solid was dissolved in a mixture of THF and 1,1,2-trichlorotrifluoroethane and added slowly to excess to hexane. The precipitate was filtered, washed with hexane and dried in a vacuum oven overnight to give 55.2 g of white polymer. From its $^{13}$C NMR spectrum, the polymer composition was found to be 27% TFE, 42% NB—F—OH and 31% tert-butyl acrylate. DSC: Tg=138° C. GPC: Mn=5900; Mw=8900; Mw/Mn=1.51. Anal. Found: C, 47.30; H, 4.83; F, 34.84.

Example 10

Terpolymer of TFE, NB—F—OH and 2-Methyl-2-Adamantyl Acrylate

A metal pressure vessel of approximate 270 mL capacity was charged with 56.6 g NB—F—OH, 1.32 g 2-methyl-2-adamantyl acrylate (which may be prepared as described by Jung (U.S. Pat. No. 6,222,061 B1 20010424)) and 30 mL 1,1,2-trichlorotrifluoroethane. The vessel was closed, cooled to about −15° C. and pressured to 400 psi with nitrogen and vented several times. TFE (40.0 g) was added and the vessel was heated to 50° C. When the temperature and pressure stabilized, a solution of 46.4 g of NB—F—OH and 24.6 g of 2-methyl-2-adamantyl acrylate diluted to 100 mL with 1,1,2-trichlorotrifluoroethane was pumped into the reactor at a rate of 0.10 mL/minute for 12 hr. Simultaneously with the monomer feed solution, a solution of 4.85 g Perkadox® 16N and 30–35 mL methyl acetate diluted to 75 mL with 1,1,2-trifluorotrichloroethane was pumped into the reactor at a rate of 2.0 mL/minute for 6 minutes and then at a rate of 0.08 mL/minute for 8 hr. At 1, 2 and 3 hours after starting addition of the monomer feed solution, 3.2 g portions of TFE were added to the reactor. After a 16 hour reaction time, the vessel was cooled to room temperature and vented to 1 atmosphere. The recovered polymer solution was added slowly to an excess of hexane while stirring. The precipitate was filtered, washed with hexane and dried in a vacuum oven. The resulting solid was dissolved in a mixture of THF and 1,1,2-trichlorotrifluoroethane and added slowly to excess to hexane. The precipitate was filtered, washed with hexane and dried in a vacuum oven overnight to give 32.3 g of white polymer. From its $^{13}$C NMR spectrum, the polymer composition was found to be 25% TFE, 40% NB—F—OH and 35% 2-methyl-2-adamantyl acrylate. DSC: Tg=129° C. GPC: Mn=6200; Mw=9200; Mw/Mn=1.48. Anal. Found: C, 54.75; H, 5.52; F, 27.48.

Example 11

Synthesis of a NB—F—OH/NB—F—O-t-BuAc Copolymer by Polymer Modification

A 500 mL round bottom flask with mechanical stirrer, addition funnel and reflux condenser was charged with 53.6 g of a NB—F—OH vinyl addition homopolymer which was calculated to contain 0.185 mol of hexafluoroisopropanol groups, 200 mL of acetonitrile and 30.6 g (0.222 mol) of potassium carbonate. This mixture was refluxed for 0.5 hr. tert-Butyl bromoacetate (10.8 g, 0.055 mol) was added dropwise and the resulting mixture was refluxed for 3 hr. The mixture was cooled to room temperature and diluted by addition of 300 mL acetone. The mixture was then filtered and concentrated under vacuum to a volume of approximately 200 mL. The concentrated mixture was slowly poured into 5.4 L 1.0% aqueous HCl. The resulting precipitate was filtered and washed with water. The precipitate was then dissolved in 200 mL acetone; to this solution was added a solution of 5 mL water and 3 mL 36% aqueous HCl. The resulting solution was slightly cloudy. It was poured into 5.4 L of water. The precipitate was washed with water several times and dried to afford 44.0 g of NB—F—OH/NB—F—O-t-BuAc copolymer. $^{19}$F NMR ($\partial$ acetone-$d_6$) −□73.1 (s, assigned to units from the NB—F—O-t-BuAc), −75.4 (s, assigned to units from NB—F—OH) By integration of the spectrum, the composition of the polymer was found to 64% NB—F—OH and 36% NB—F—O-t-BuAc. Samples of the polymer were spin coated from a 5% solution in 2-heptanone. The absorption coefficient at 157 nm was determined to be 3.15 $\mu m^{-1}$ at a film thickness of 47.2 nm and 2.70 $\mu m^{-1}$ at a film thickness of 45.7 nm.

Example 12

Synthesis of a NB-Me-F—OH/NB-Me-F—O-t-BuAc Copolymer by Polymer Modification

Example 10 was repeated with the following exception: a NB—Me—F—OH vinyl addition homopolymer was used instead of NB—F—OH vinyl addition homopolymer, to synthesize a NB-Me-F—OH/NB-Me-F—O-t-BuAc copolymer. $^{19}$F NMR ($\partial$, acetone-$d_6$) −73.2 (s, assigned to units from the NB—F—O-t-BuAc), −75.3 (s, assigned to units from NB—F—OH) By integration of the spectrum, the composition of the polymer was found to 68% NB—F—OH and 32% NB—F—O-t-BuAc.

Example 13

The following solution was prepared and magnetically stirred overnight.

| Component | Wt. (gm) |
| --- | --- |
| TFE/NB-F-OH/NB-F-O-t-BuAC copolymer from Example 6 | 0.433 |
| 2-Heptanone | 4.268 |
| t-Butyl Lithocholate | 0.050 |
| 6.82% (wt) solution of triphenylsulfonium nonaflate dissolved in 2-heptanone which had been filtered through a 0.45 $\mu$m PTFE syringe filter. | 0.249 |

Spin coating was done using a Brewer Science Inc. Model-100CB combination spin coater/hotplate on a 4 in. diameter Type "P", <100>orientation, silicon wafer. Development was performed on a Litho Tech Japan Co. Resist Development Analyzer (Model-790).

The wafer was prepared by depositing 6 ml of hexamethyldisilazane (HMDS) primer and spinning at 5000 rpm for 10 seconds. Then about 3 ml of the above solution, after filtering through a 0.45 $\mu$m PTFE syringe filter, was deposited and spun at 3000 rpm for 60 seconds and baked at 120° C. for 60 seconds.

248 nm imaging was accomplished by exposing the coated wafer to light obtained by passing broadband UV light from an ORIEL Model-82421 Solar Simulator (1000 watt) through a 248 nm interference filter which passes about 30% of the energy at 248 nm. Exposure time was 5 seconds, providing an unattenuated dose of 3.4 mJ/cm$^2$. By using a mask with 18 positions of varying neutral optical density, a wide variety of exposure doses were generated. After exposure the exposed wafer was baked at 100° C. for 60 seconds.

The wafer was developed in aqueous tetramethylammonium hydroxide (TMAH) solution (OHKA NMD-3, 2.38% TMAH solution) for 5 seconds. This test generated a positive image with a clearing dose of </=3.4 mJ/cm$^2$.

Example 14

Example 13 was repeated with the following exceptions: TFE/NB—F—OH/NB—F—O-t-BuAc copolymer that was prepared by the procedure similar to that described in Example 7 and having a composition by $^{13}$C NMR: of 47/37/15 was used instead of the TFE/NB—F—OH/NB—F—O-t-BuAc copolymer from Example 6.

The wafer was prepared by depositing 6 ml of hexamethyldisilazane (HMDS) primer and spinning at 5000 rpm for 10 seconds. Then about 3 ml of the above solution, after filtering through a 0.45 $\mu$m PTFE syringe filter, was deposited and spun at 2500 rpm instead of 3000 rpm for 60 seconds and baked at 120° C. for 60 seconds.

Exposure time was 30 seconds instead of 5 seconds, providing an unattenuated dose of 20.5 mJ/cm$^2$ instead of 3.4 mJ/cm$^2$. After exposure the exposed wafer was baked at 100° C. for 60 seconds instead of 120° C. for 60 seconds.

The wafer was developed in aqueous tetramethylammonium hydroxide (TMAH) solution (OHKA NMD-3, 2.38% TMAH solution) for 60 seconds instead of 5 seconds. This test generated a positive image with a clearing dose of </=20.5 mJ/cm$^2$.

Example 15

Example 13 was repeated with the following exceptions: The following solution was prepared and magnetically stirred overnight.

| Component | Wt. (gm) |
| --- | --- |
| TFE/NB-F-OH/tBA copolymer prepared by the procedure described in Example 8 but having the following composition by $^{13}$C NMR: 39/42/18 | 0.535 |
| 2-Heptanone | 5.121 |
| t-Butyl Lithocholate | 0.045 |
| 6.82% (wt) solution of triphenylsulfonium nonaflate dissolved in 2-heptanone which had been filtered through a 0.45 $\mu$m PTFE syringe filter. | 0.299 |

The wafer was prepared as described in Example 13. After exposure the exposed wafer was baked at 120° C. for 120 seconds instead of 100° C. for 60 seconds. The wafer was developed for 15 seconds.

This test generated a positive image with a clearing dose of </=20.5 mJ/cm$^2$.

Example 16

Example 14 was repeated with the following exceptions: The following solution was prepared and magnetically stirred overnight.

| Component | Wt. (gm) |
|---|---|
| TFE/NB-F-OH/tBA copolymer prepared by the procedure described in Example 9 but having the following composition by $^{13}$C NMR: 35/42/22 | 0.490 |
| 2-Heptanone | 4.121 |
| t-Butyl Lithocholate | 0.090 |
| 6.82% (wt) solution of triphenylsulfonium nonaflate dissolved in 2-heptanone which had been filtered through a 0.45 μm PTFE syringe filter. | 0.299 |

This test generated a positive image with a clearing dose of </=20.5 mJ/cm$^2$.

Example 17

Example 15 was repeated with the following exceptions: TFE/NB—F—OH/MAdA copolymer of the type described in Example 10 but prepared by a batch procedure as described in Example 8, and having the following composition by $^{13}$C NMR: 28/46/27 was used instead of the TFE/NB—F—OH/tBA copolymer and the amounts used were as follows.

| Component | Wt. (gm) |
|---|---|
| TFE/NB-F-OH/MAdA copolymer of the type described in Example 10 but prepared by a batch procedure as described in Example 8, and having the following composition by $^{13}$C NMR: 28/46/27 | 0.490 |
| 2-Heptanone | 4.121 |
| t-Butyl Lithocholate | 0.090 |
| 6.82% (wt) solution of triphenylsulfonium nonaflate dissolved in 2-heptanone which had been filtered through a 0.45 μm PTFE syringe filter. | 0.299 |

Exposure time was 180 seconds instead of 30 seconds, providing an unattenuated dose of 123 mJ/cm$^2$ instead of 20.5 mJ/cm$^2$. After exposure the exposed wafer was baked at 120° C. for 60 seconds instead of 120° C. for 120 seconds.

The wafer was developed for 60 seconds instead of 15 seconds.

This test generated a positive image with a clearing dose of </=21.4 mJ/cm$^2$.

Example 18

Example 15 was repeated with the following exceptions: NB—F—OH/NB—F—O-t-BuAc copolymer of the type described in Example 11 was used instead of the TFE/NB—F—OH/tBA copolymer and the amounts used were as follows.

| Component | Wt. (gm) |
|---|---|
| NB-F-OH/NB-O-t-BuAc copolymer in Example 11 | 0.535 |
| 2-Heptanone | 4.121 |
| t-Butyl Lithocholate | 0.045 |
| 6.82% (wt) solution of triphenylsulfonium nonaflate dissolved in 2-heptanone which had been filtered through a 0.45 μm PTFE syringe filter. | 0.299 |

After exposure the exposed wafer was baked at 100° C. for 60 seconds instead of 120° C. for 120 seconds.

The wafer was developed in aqueous tetramethylammonium hydroxide (TMAH) solution (OHKA NMD-3, 2.38% TMAH solution) for 60 seconds instead of 15 seconds.

This test generated a positive image with a clearing dose of </=20.5 mJ/cm$^2$.

Example 19

Example 18 was repeated with the following exceptions: NB—F—OH/NB—F—O-t-BuAc copolymer of the type described in Example 12 was used instead of the NB—F—OH/NB—F—O-t-BuAc copolymer. No t-butyl lithocholate was present in the formulation. The amounts used were as follows.

| Component | Wt. (gm) |
|---|---|
| NB-Me-F-OH/NB-Me-O-t-BuAc copolymer in Example 12 | 0.580 |
| 2-Heptanone | 4.121 |
| 6.82% (wt) solution of triphenylsulfonium nonaflate dissolved in 2-heptanone which had been filtered through a 0.45 μm PTFE syringe filter. | 0.299 |

This test generated a positive image with a clearing dose of </=20.5 mJ/cm$^2$.

What is claimed is:

1. A fluorine-containing polymer comprising a group having the structure:

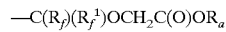

wherein $R_f$ and $R_f^1$ are the same or different fluoroalkyl groups of from 1 to 10 carbon atoms, or taken together are $(CF_2)_n$, wherein n is 2 to 10 and $R_a$ is H or an acid- or base-labile protecting group, the fluorine-containing polymer being substantially free of aromatic groups.

2. The fluorine-containing polymer of claim 1 further comprising a repeat unit derived from at least one ethylenically unsaturated compound containing a functional group having the structure:

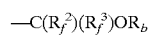

wherein $R_f^2$ and $R_f^3$ are the same or different fluoroalkyl groups of from 1 to 10 carbon atoms, or taken together are $(CF_2)_n$, wherein n is 2 to 10 and $R_b$ is H or an acid- or base-labile protecting group.

3. The fluorine-containing polymer of claim 1 having the following structure:

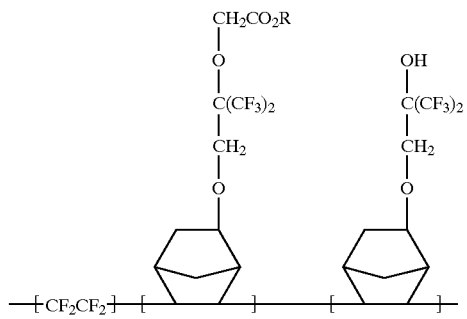

wherein R is a tertiary alkyl group.

4. The fluorine-containing polymer of claim 1 having the following structure:

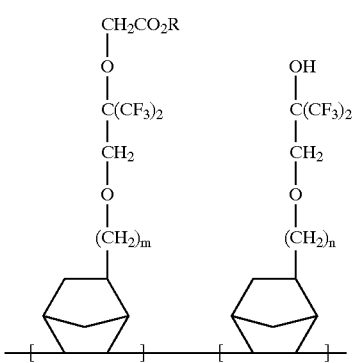

wherein m and n are independently zero or one, and R is a tertiary alkyl group.

5. The fluorine-containing polymer of claim 1, wherein the functional group, —C($R_f$)($R_f^1$)OCH$_2$C(O)OR$_a$, is prepared by reaction of —C(CF$_3$)$_2$OH with a bromo-t-butyl acetate in the presence of base.

6. The fluorine-containing polymer of claim 1 prepared by polymerization of the monomer:

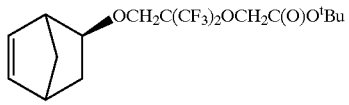

wherein $^t$Bu is tert-butyl.

7. The fluorine-containing copolymer of claim 1 further comprising:
   a) a repeat unit derived from an ethylenically unsaturated compound that is cyclic or polycyclic;
   b) a repeat unit derived from an ethylenically unsaturated compound containing at least one fluorine atom covalently attached to an ethylenically unsaturated carbon atom.

8. The fluorine-containing copolymer of claim 7, wherein $R_f$ and $R_f^1$ are CF$_3$.

9. The polymer of claim 7 further comprising (iv) a group derived from CH$_2$=CHCO$_2$R$_c$, wherein R$_c$ is hydrogen or a tertiary hydrocarbon group.

10. The polymer of claim 9, wherein R$_c$ is tert-butyl or 2-methyl-2-adamantyl.

11. The polymer of claim 1, wherein R$_a$ is tert-butyl.

12. A photoresist composition comprising a fluorine-containing polymer comprising a group having the structure:

wherein $R_f$ and $R_f^1$ are the same or different fluoroalkyl groups of from 1 to 10 carbon atoms, or taken together are (CF$_2$)$_n$, wherein n is 2 to 1, and R$_a$ is H or an acid- or base-labile protecting group and the fluorine-containing polymer is substantially free of aromatic groups.

13. The photoresist of claim 12 further comprising at least one photoactive component.

14. The photoresist of claim 12 further comprising at least one solvent.

15. The photoresist of claim 14 wherein the solvent is selected from the group consisting of 2-heptanone; propylene glycol methyl ether acetate (PGMEA); chlorobenzene; methyl ethyl ketone; propylene carbonate; cyclohexanone; methyl isobutyl ketone; supercritical CO$_2$; 2,3-dihydroperfluoropentane; t-butyl alcohol; methyl acetate; THF; methyl alcohol; 1,1,2-trichlorotrifluoroethane; isopropyl alcohol; methylene chloride; acetone; methyl ethyl ketone; acetonitrile; ethyl lactate; and mixtures thereof.

16. The photoresist of claim 12 wherein the fluorine-containing polymer further comprises a repeat unit derived from at least one ethylenically unsaturated compound containing a functional group having the structure:

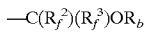

wherein $R_f^2$ and $R_f^3$ are the same or different fluoroalkyl groups of from 1 to 10 carbon atoms, or taken together are (CF$_2$)$_n$, wherein n is 2 to 10 and R$_b$ is H or an acid- or base-labile protecting group.

17. The photoresist of claim 16, wherein R$_a$ is tert-butyl.

18. The photoresist of claim 16 wherein the fluorine-containing polymer has an absorption coefficient of less than 4.0 $\mu$m$^{-1}$ at a wavelength of 157 nm.

19. The photoresist of claim 18, wherein the fluorine-containing polymer has an absorption coefficient of less than 3.0 $\mu$m$^{-1}$ at a wavelength of 157 nm.

20. The photoresist composition of claim 12 further comprising:
   a) a repeat unit derived from an ethylenically unsaturated compound that is cyclic or polycyclic;
   b) a repeat unit derived from an ethylenically unsaturated compound containing at least one fluorine atom covalently attached to an ethylenically unsaturated carbon atom; and
   c) a functional group having the structure:

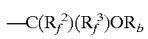

wherein $R_f^2$ and $R_f^3$ are the same or different fluoroalkyl groups of from 1 to 10 carbon atoms, or taken together are (CF$_2$)$_n$, wherein n is 2 to 10 and R$_b$ is H or an acid- or base-labile protecting group.

21. The photoresist composition of claim 20 further comprising a group derived from CH$_2$=CHCO$_2$R$_c$, wherein R$_c$ is hydrogen or a tertiary hydrocarbon group.

22. The photoresist of claim 21, wherein R$_c$ is tert-butyl or 2-methyl-2-adamantyl.

23. The photoresist of claim 20 wherein R$_b$ is H.

24. The photoresist of claim 20 wherein the ethylenically unsaturated compound containing at least one fluorine atom covalently attached to an ethylenically unsaturated carbon atom is tetrafluoroethylene.

25. A process for preparing a photoresist image on a substrate comprising, in order:
   (a) forming a photoresist layer on a substrate from a photoresist composition, wherein the photoresist composition comprises a fluorine-containing polymer comprising a group having the structure:

wherein $R_f$ and $R_f^1$ are the same or different fluoroalkyl groups of from 1 to 10 carbon atoms, or taken together are (CF$_2$)$_n$, wherein n is 2 to 10 and R$_a$ is an acid- or base-labile protecting group, the fluorine-containing polymer being substantially free of aromatic groups;
   (b) imagewise exposing the photoresist layer to form imaged and non-imaged areas; and
   (c) developing the exposed photoresist layer having imaged and non-imaged areas to form a relief image on the substrate.

26. The process of claim 25, wherein the photoresist layer is formed by spinning the photoresist composition onto the substrate, followed by drying.

27. The process of claim 25 wherein the photoresist composition further comprises at least one photoactive component and a solvent.

28. The process of claim 27 wherein the solvent is selected from the group consisting of 2-heptanone; propylene glycol methyl ether acetate (PGMEA); chlorobenzene; methyl ethyl ketone; propylene carbonate; cyclohexanone; methyl isobutyl ketone; supercritical $CO_2$; 2,3-dihydroperfluoropentane; t-butyl alcohol; methyl acetate; THF; methyl alcohol; 1,1,2-trichlorotrifluoro-ethane; isopropyl alcohol; methylene chloride; acetone; methyl ethyl ketone; acetonitrile; ethyl lactate; and mixtures thereof.

29. The process of claim 25, wherein the imagewise exposure is performed using ultraviolet radiation having a wavelength of 157 nm.

30. The process of claim 25, wherein the imagewise exposure is performed using ultraviolet radiation having a wavelength of 193 nm.

31. The process of claim 25 wherein the photoresist composition in light-exposed areas is rendered soluble in aqueous base developer upon exposure to patterned ultraviolet radiation of wavelength less than or equal to 365 nm.

32. The process of claim 32 wherein the fluorine-containing polymer further comprises a repeat unit derived from at least one ethylenically unsaturated compound containing a functional group having the structure $C(R_f^2)(R_f^3)OR_b$ wherein $R_f^2$ and $R_f^3$ are the same or different fluoroalkyl groups of from 1 to 10 carbon atoms, or taken together are $(CF_2)_n$, wherein n is 2 to 10 and $R_b$ is an acid- or base-labile protecting group.

33. The process of claim 25, wherein $R_a$ in the fluorine-containing polymer is a tertiary alkyl group.

34. A photoresist composition comprising a fluorine-containing polymer, wherein the fluorine-containing polymer comprises:

a) a repeat unit derived from an ethylenically unsaturated compound that is cyclic or polycyclic;

b) a repeat unit derived from an ethylenically unsaturated compound containing at least one fluorine atom covalently attached to an ethylenically unsaturated carbon atom;

c) a functional group with the structure:

$—C(R_f^2)(R_f^3)OR_b$ wherein $R_f^2$ and $R_f^3$ are the same or different fluoroalkyl groups of from 1 to 10 carbon atoms, or taken together are $(CF_2)_n$, wherein n is 2 to 10 and $R_b$ is H or an acid- or base-labile protecting group; and d) a repeat unit derived from an ethylenically unsaturated compound, $CH_2=CHCO_2R_c$, wherein $R_c$ is a tertiary alkyl group.

35. The photoresist of claim 34, wherein $R_c$ is tert-butyl acrylate or 2-methyl-2-adamantyl acrylate.

36. The photoresist of claim 35, wherein $R_b$ is H.

37. The photoresist of claim 36, wherein the ethylenically unsaturated compound containing at least one fluorine atom covalently attached to an ethylenically unsaturated carbon atom is tetrafluoroethylene.

* * * * *